United States Patent [19]

Russell et al.

[11] Patent Number: 5,164,324
[45] Date of Patent: Nov. 17, 1992

[54] LASER TEXTURING

[75] Inventors: Stephen D. Russell; Douglas A. Sexton, both of San Diego; Eugene P. Kelley, Spring Valley, all of Calif.

[73] Assignee: The United States of America as represented by the Secretary of the Navy, Washington, D.C.

[21] Appl. No.: 589,839

[22] Filed: Sep. 26, 1990

Related U.S. Application Data

[63] Continuation-in-part of Ser. No. 501,707, Mar. 29, 1990, and a continuation-in-part of Ser. No. 508,317, Apr. 10, 1990.

[51] Int. Cl.$^5$ .............................................. H01L 21/26
[52] U.S. Cl. ...................................... 437/19; 437/985
[58] Field of Search ................................ 437/19, 985

[56] References Cited

U.S. PATENT DOCUMENTS

| | | | |
|---|---|---|---|
| 4,545,823 | 10/1985 | Drowley | 437/19 |
| 4,865,923 | 9/1989 | Ralston et al. | 437/19 X |
| 5,061,643 | 10/1991 | Yagi | 437/19 |

OTHER PUBLICATIONS

Gutman, *Halogen Chemistry*, vol. 2, (New York; Academic Press, 1967) pp. 173-189.
Winters et al., *Surface Processes in Plaza-Assisted Etching Environments*, J. Vac. Sci. Tech. B, vol. 1, (1983), p. 469.
Heath et al., *Plasma Processing for VLSI*, Academic Press, 1985, San Diego, pp. 487-502.
Osgood, Jr et al., *Localized Laser Etching of Compound Semiconductors in Aqueous Solution*, App. Phys. Lett., vol. 40, 1982, p. 391.
Russell et al., *Excimer Laser-Assisted Etching of Si Using Chloropentafluoroethane*, Mat. Res. Soc. Proc., vol. 158, 1990, pp. 325-330.
Mogyorosi et al., *Laser-Induced Chemical Etching—Atmosphere: II II Cont. Irr.*, vol. 45, 293 (1988).
Ehrlich et al., *A Review of Laser-Microchemical Processing*, J. Vac. Sci. Tech. B, vol. 1, p. 969 (1983).
Houle, *Basic Mechanisms in Laser Etching and Deposition*, Appl. Phys. A, vol. 41, 315 (1986).
Bauerle, *Chem. Processing with Lasers: Recent Developments*, Appl. Phys. B, vol. 46, 261 (1988).
Chuang, *Laser-Induced Chemical Etching—Challenges*, Mat'3 ls Res. Soc. Symposia Proc., vol. 29, 1984, pp. 185-194.
von Gutfeld et al., *Laser-Enhanced Etching—In KOH*, App. Phys. Lett., vol. 40, 1982, p. 352.
Bunkin et al., *Laser Control over Electrochemical Processes*, SPIE vol. 473, Symposium OPTIKA '84, pp. 31-37.

(List continued on next page.)

*Primary Examiner*—Peter A. Nelson
*Attorney, Agent, or Firm*—Harvey Fendelman; Thomas Glenn Keough

[57] ABSTRACT

A non-contact method to impart a texture to a surface using laser irradiation uses an excimer laser to illuminate a sample immersed in a halocarbon ambient thereby initiating a photo/thermal chemical reaction which etches the sample only in the area illuminated with sufficient laser fluence. The resulting etched area can be repetively illuminated and etched to provide a textured surface to reduce extraneous reflections, or for micromachining, decorative texturing and marking. This technique is particularly well suited to improve the performance of backside illuminated CCDs by reducing the background (dark) signal, increase resolution and responsivity uniformity. The technique is compatible with other laser processing procedures and can be implemented with a variety of CCD enhancements such as improved dark current and blue response from laser doping or activation of backside implants. The non-corrosive nature of the halocarbon ambients allows the laser texturing process to be performed on pre-packaged, pre-tested devices and therefore can salvage parts which had failed performance specifications. This process therefore can improve device performance as well as yield, reliability and fabrication costs.

6 Claims, 4 Drawing Sheets

OTHER PUBLICATIONS

Brunauer et al., *Adsorption of Gases in Multimolecular Layers,* J. Am. Chem. Soc., vol. 60, 1938, p. 309.

Gauthier et al., *Mechanism Investigations—Induced Desorption,* Phys. Stat. Sol. (A), vol. 38, 1976, p. 447.

Kullmer et al., *Laser-Induced Chemical Etching—In Chlorine Atmosphere, I Pulsed Irr.,* vol. 45, 293 (1988).

Kullmer et al., Laser-Induced Chem. Etching—III Combined CW and Pulsed Irr., vol. 47, 377, (1988).

Horiike et al, *Excimer-Laser Etching on Silicon,* Appl. Phys. A, vol. 44, 313, (1987).

Chuang, *Chlorine Surface Interaction and—Reactions,* J. Vac. Sci. Tech. B, vol. 3, 1507 (1985).

Palmer et al., *Laser-Induced Etching—by $F_2$/Ne,* Conf. on Lasers—Series 1988, vol. 7, 284, Opt. Soc. of America.

Brannon, *Chemical Etching of Silicon—Dissociation of $NF_3$,* Appl. Phys. A, vol. 46, 39 (1988).

Chuang, *Infrared Laser Radiation Effects—with Silicon,* J. Chem. Phys., vol. 74, 1461 (1981).

Houle, *Photoeffects—Influence of Doping on Steady-State Phenomena,* J. Chem. Phys., vol. 79, 4237, (1983).

Houle, *Photoeffects—Response to Light,* J. Chem. Phys., vol. 80, 4851 (1984).

Chuang, *Multiple Photon Excited $SF_6$* Interaction with Silicon Surfaces, J. Chem. Phys., vol. 74, 1453, 1981.

Armacost et al. *193 NM Excimer Laser-Assisted Etching of Polysilicon,* Mat. Res. Soc. Symp. Proc., vol. 76, (1987), pp. 147–156.

Ehrlich et al., *Laser-Induced Microscopic Etching of GaAs and InP,* Appl. Phys. Lett., 36(8), Apr. 15, 1980.

Brewer et al., *Photon-Assisted Dry Etching of GaAs,* Appl. Phys. Lett., 45(4), Aug. 15, 1984.

Rytz-Froidevaux et al., *Laser Generated Microstructures,* Appl. Physl. A., vol. 37, 121–138 (1985).

Singer, *Laser Planarized Metal. Shows Several Advantages,* Semiconductor Int'l., vol. 13, No. 6, May 1990, pp. 18–20.

Kaminsky, *Micromachining of Silicon Mechanical Structures,* J. Vac. Sci. Technol. B, vol. 3, No. 4, Jul./Aug. 1985, pp. 1015–1024.

LASER TEXTURING

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This application is a continuation in part of co-pending United States Patent Applications entitled "Method of Laser-Assisted Silicon Etching Using Halocarbon Ambients" by Stephen D. Russell et al., U.S. Patent and Trademark Application Ser. No. 07/501,707 filed Mar. 29, 1990 (NC 71,978) and "Method of Laser-Assisted Etching of III-V and II-VI Semiconductor Compounds Using Chlorofluorocarbon Ambients" by Stephen D. Russell et al., U.S. Patent and Trademark Application Ser. No. 07/508,317 filed Apr. 10, 1990 (NC 72,726).

BACKGROUND OF THE INVENTION

The application of a texture to a surface implies a modification to the surface structure. An example in the semiconductor industry is the planarization of sputtered aluminum by laser heating as described in the article entitled "Laser Planarized Metal Shows Several Advantages" by P. H. Singer, chief editor, *Semiconductor International*, Vol. 13, No. 6, May 1990, pages 18 and 20. The heating process causes the aluminum to melt and flow into vias thereby forming a smooth planar surface. The smoothed surface allows for simpler processing steps for subsequent fabrication of multilayered semiconductor devices. The application of a roughened surface also has a variety of applications. In what can be called "passive" applications, a roughened surface can be used to mark or label a surface. In this case the roughened surface may also be in such a pattern as to be decorative in form. In so-called "active" applications, the rough surface can be used, for example, to inhibit reflections or increase coefficients of friction.

One particular example for the need to inhibit reflections is found in the fabrication of backside illuminated charge coupled devices (CCDs). CCDs are solid state electronic imaging devices which read out image charges from wells in an array of pixels. CCDs designed for solid-state cameras, such as camcorders, are in great demand and are widely available. They have been designed to provide adequate performance when viewing brightly illuminated scenes. However, in astronomical, scientific and military applications their spectral response, readout noise, dark current, full well-capacity and blooming characteristics are not satisfactory.

To overcome the limitations of imaging through the polysilicon gates that necessarily cover all of the sensitive pixel array, it would be desirable to illuminate the CCD from the backside if the silicon substrate were thin enough. In other words, a solution to obtaining better light sensitivity would be the thinning of the backside of the CCD to a total thickness of roughly 10 microns. The need is quite apparent for new microelectronic processing schemes to produce thin membranes such as those required for the backside illuminated CCDs, such a process is disclosed in the above identified S. D. Russell et al. "Excimer Laser-Assisted Etching of Silicon Using Halocarbon Ambients", U.S. patent pending application Ser. No. 07/501,707. Additional features that should attend this thinning process are the creation of a smooth surface for uniform imaging, nonreflecting sidewalls for stray light rejection and large (approximately 2 mm by 2 mm) square cross section for optimal illumination of the active area of the array.

A conventional fabrication procedure for backside illuminated CCDs calls for chemical thinning of the silicon. However, the standard wet chemical thinning-etch procedure produces an extremely low yield process and requires the handling of fragile thin silicon membranes. Furthermore, the chemical thinning requires two processes, a deep etch using potassium hydroxide and a subsequent Dash polishing etch. The active area of the array is normally fabricated by chemically thinning a (100) oriented silicon wafer using the potassium hydroxide (KOH) etch. The potassium hydroxide anisotropically etches to the (111) crystallographic plane in silicon leaving smooth sidewalls at an angle of 54.7 degrees to the surface of the array (as described in "Micromachining of Silicon Mechanical Structures" by G. Kaminsky in *J. Vac. Sci. Technol. B*, Vol. 3, No. 4, Jul/Aug 1985, pages 1015–1024) and shown in FIG. 1. This smooth surface acts as a mirror to reflect extraneous light onto the active array of the CCD causing spurious images thereby degrading response uniformity, image resolution and increasing background (dark) signal. Under stress conditions such as a radiation environment, these parameters degrade further subsequently failing to meet device specifications leading the problems mentioned above to be exascerbated. Therefore, there is a need in the fabrication of CCDs to roughen these sidewalls without causing damage to any other portion of the electronic circuit. The Dash etch mentioned above, consists of applying a mixture of acetic, nitric and hydrofluoric acids along with a surfactant. The Dash etch process used for polishing the thinned membrane also requires additional masking to protect the frontside metalization and backside gold eutectic used for packaging and therefore does not eliminate sidewall reflections. Additional cleaning and inspection steps are required to complete the conventional thinning process. Elimination of these steps would allow further "dry" processing of the thinned die, such as laser doping or dopant activation. In addition, the minimization of the required number of processing steps always is desirable in this microelectronic processing procedure to maximize the yield and reliability while also reducing costs.

The preferred method proposed here utilizes an excimer laser in a non-contact process to promote a chemical reaction between a halocarbon ambient and the sample. The laser-assisted chemical reaction results in a roughened surface which will not scatter light. The use of a non-reactive ambient allows for texturing pre-packaged and pretested devices thereby minimizing fabrication costs and salvaging devices which fail specifications. Subsequent laser processing steps, such as activation of backside implant, can be easily implemented before or after this process.

It is evident from the above discussion that advances in microelectronics often are limited by the multitude of relatively complicated processing steps required to produce the devices. A further example of the large number of processing steps required in a typical process flow is shown by a simple etching of a pattern into bulk silicon. This requires the application of a precise thickness and uniform film of photoresist with a subsequent low temperature heat treatment. This is followed by exposure to a lamp through a mask in contact with the photoresist and chemical development of the resist. Another heat treating step is next, then the silicon is chemically etched and, lastly, the remaining photoresist subsequently is stripped from the silicon. These seven steps are typical in standard etching techniques used in the semiconductor industry. It becomes apparent that significant savings and yield could be obtained through the more simplified procedures that might be provided by a contactless form of etching. The reduced complexity of such a procedure would eliminate the many time consuming and costly steps of the conventional etching technique, and in the case of roughening the sidewalls of a backside illuminated CCD provide a unique method to rework tested parts.

In view of the foregoing, noncontact processing is receiving widespread interest in the microelectronic industry. A variety of laser-assisted processing techniques to modify materials used in this industry are being pursued, particularly with the introduction of the excimer laser which typically emits at the shorter wavelengths. The works of D. Ehrlich et al. in their article "A review of Laser-Microchemical Processing" *J. Vac. Sci. Technol. B.*, 1, 969 (1983), F. Houle, in her article entitled "Basic Mechanisms in Laser Etching and Deposition" *Appl. Phys. A.* 41, 315 (1986), D. Bauerle in the article entitled "Chemical Processing with Lasers: Recent Developments" *Appl. Phys. B,* 46, 261 (1988), and T. Chuang in the article entitled "Laser-Induced Chemical Etching of Solids: Promises and Challenges" in A. Johnson et al., ed's, *Laser Controlled Chemical Processing of Surfaces,* Materials Research Society Symposia Proceedings, Vol. 29 (New York: North Holland, 1984), pp. 185–194, offer a review of the effort involved with laser-assisted processing techniques. As a consequence, laser processing has grown from a purely research effort into a production tool. Early on, however, investigations related to laser processing of silicon led to the conclusion that laser ablation of silicon using an excimer laser was considered undesirable since the surface quality would be poor, although the rate of material removal would be high. For texturing applications where particulate control is of little or no concern, ablative techniques are applicable. However, the use of ablation for texturing applications has not been previously reported. The use of halogens to etch silicon is well established by the text of the Gutmann, *Halogen Chemistry*, Vol 2 (New York: Academic Press, 1967), pp. 173–180. In addition, an existing body of research for plasma processing of silicon is described by H. F. Winters et al. in the article "Surface Processes in Plasma-Assisted Etching Environments" *J. Vac. Sci. Technol. B,* 1, 469 (1983) and B. A. Heath et al. in the article "Plasma Processing for VLSI" chapter 27 in M. G. Einspruch, ed. *VLSI Handbook* (San Diego: Academic Press, 1985) pp. 487–502.

The laser-assisted etching of silicon has been examined using a chlorine ambient by R. Kullmer et al. in their article "Laser-Induced Chemical Etching of Silicon in Chlorine Atmosphere: I. Pulsed Irradiation" *Appl. Phys. A,* 43, 227 (1987), P. Mogyorosi et al. in the article entitled "Laser-Induced Chemical Etching of Silicon in Chlorine Atmosphere: II. Continuous Irradiation" *Appl. Phys. A,* 45, 293 (1988), R. Kullmer et al. in the article "Laser-Induced Chemical Etching of Silicon in Chlorine Atmosphere: Combined CW and Pulsed Irradiation" *Appl. Phys. A,* 47, 377 (1988), Y. Horiike et al. in the article "Excimer Laser Etching on Silicon" *Appl. Phys. A,* 44, 313 (1987) and W. Sesselmann et al. in their article entitled "Chlorine Surface Interaction and Laser-Induced Surface Etching Reactions" *J. Vac. Sci. Technol. B,* 3, 1507 (1985). S. Palmer et al. in their article entitled "Laser-Induced Etching of Silicon at 248 nm in $F_2$/Ne" *Conference on Lasers and Electrooptics Technical Digest Series* 1988, Vol. 7, 284 (Optical Society of America, Washington, D.C., 1988) examined the fluorine ambient.

The use of nitrogen trifluoride ambient was discussed by J. H. Brannon in his article entitled "Chemical Etching of Silicon by $CO_2$ Laser-Induced Dissociation of $NF_3$" *Appl. Phys. A.* 46, 39 (1988) and the above referenced article by Y. Horiike et al. The use of the halogenated ambient xenon difluoride was discussed by T. Chuang, "Infrared Laser Radiation Effects on $XeF_2$ Interaction with Silicon" *J. Chem. Phys.,* 74, 1461 (1981), by F. Houle "Photoeffects on the Fluorination of Silicon: I. Influence on Doping on Steady State Phenomena" *J. Chem. Phys.,* 79, 4237 (1983) by F. Houle in the article "Photoeffects on the Fluorination of Silicon: II. Kinetics of the Initial Response to Light" *J. Chem. Phys.,* 80, 4851 (1984). And, the use of halogenated ambient sulphur hexafluoride was examined by T. Chuang in his article entitled "Multiple Photon Excited $SF_6$ Interaction with Silicon Surfaces" *J. Chem. Phys.,* 74, 1453 (1981).

Typical etch rates of approximately one angstrom per pulse have been reported for the ambients of the preceding paragraphs under a variety of conditions. Such etch rates with the high pulse repetition rate of the excimer laser (100 Hz typical, 250 Hz available) are satisfactory to meet yield requirements of some applications. However, difficulties in handling and processing pure halogens such as chlorine and fluorine make them less suitable for inserting into existing manufacturing processes. Furthermore, pure halogens and many halogenated ambients are corrosive in nature and will spontaneously react with some (or all) of the materials composing a partially fabricated microelelectronic device. Masking, therefore, is required in such ambients despite the noncontact nature inherent in laser processing. Masking may be difficult or impossible in many applications. In addition, the detrimental effects of chlorine on the radiation hardness of silicon devices makes it potentially unsuitable for a wide variety of military or space applications.

The use of laser-assisted wet etching was explored by R. Osgood Jr. et al. in "Localized Laser Etching of Compound Semiconductors in Aqueous Solutions" *Appl. Phys. Lett.,* 40, 391 (1982), R. von Gutfeld et al. in "Laser-Enhanced Etching in KOH" *Appl. Phys. Lett.,* 40, 352 (1982) and F. Bunkin et al. in "Laser Control Over Electrochemical Processes" SPIE Vol. 473, *Symposium OPPIKA'84,* Vol. 473, pp. 31–37. The drawback to the laser-assisted wet etching technique is that it requires a different processing chamber to that of the gaseous "dry" etching technique and would require additional handling for further processing.

M. D. Armacost, S. V. Babu, S. V. Nguyen, J. F. Rembetski, in their article "193 nm Excimer Laser-Assisted Etching of Polysilicon", *Mat. Res. Soc. Symp. Proc.,* Vol. 76, (1987), pp. 147–156, examine various ambients for etching polysilicon. They used two halocarbon ambients but found etch profiles that were not repeatable or did not show any appreciable etching. They did not examine the effects of etching silicon, nor investigate the critical parameters and processing windows required to achieve the results attained in accordance with this inventive concept. S. D. Russell and D. A. Sexton in our article entitled "Excimer Laser-Assisted Etching of Silicon using Chloropentafluoroethane" in R. Rosenberg, A. F. Bernhardt, J. G. Black, eds. *In-Situ Patterning: Selcective Area Deposition and Etching*, (Mat. Res. Soc. Proc., Vol. 158, Pittsburgh, Pa., 1990), pages 325–330, we discuss one possible laser-assisted chemical reaction used in laser texturing, however there is no mention of the resulting surface texture nor the effect and benefits of texture as disclosed here.

Thus, there is a continuing need in the state of the art for a contactless technique utilizing an excimer laser to promote a chemical reaction between an ambient and a sample thereby imparting a surface texture that produces the above mentioned benefits, eliminates many standard processing steps and has the advantage of processing in a prepackaged and pretested device and that can be extended to other applications requiring surface modification techniques.

SUMMARY OF THE INVENTION

The present invention is directed to providing a contactless technique for imparting a texture to a surface by promoting a chemical etching reaction between a gaseous ambient, such as a chlorofluorocarbon, and a sample, such as silicon, exposed to the UV energy emitted by an excimer laser.

An object of the invention is impart a texture to a surface.

Another object is to eliminate spurious reflections eminating from a surface by imparting a roughened texture.

Yet another object is to impart a surface texture without contact with the surface in question.

Another object is to texture a surface locally using a laser to achieve accurate spatial control for both "active" and "passive" applications described above.

An object of the invention is to reduce the processing steps associated with microelectronic fabrications.

Another object is to provide a microelectronic processing method utilizing a nonreactive or noncorrosive ambient.

Another object is to provide a laser texturing process with halocarbons that only react with silicon where the laser energy is impinging with sufficient fluence.

Another object is to provide a laser texturing process with chlorofluorocarbons that only react with silicon where the laser energy is impinging with sufficient fluence.

Another object is to provide a laser texturing process for etching in a pretested package die without expensive handling, damage or complex masking.

Another object is to provide a laser texturing process for etching in a pretested package die thereby enabling the reworking of a die which had failed performance specifications.

Yet another object is to provide a laser texturing process for etching in a pretested package die thereby salvaging parts that could not be reworked by conventional techniques.

Another object is to provide a laser texturing process in an ambient that significantly eliminates processing steps, thereby increasing reliability and yield.

Another object is to provide a laser texturing process in a halocarbon ambient that significantly eliminates processing steps, thereby increasing reliability and yield.

Another object is to provide a laser texturing process for pattern creation for either functional or decorative applications.

Yet another object is to provide a laser texturing process for roughening the sidewalls of backside illuminated charged coupled devices.

Another object is to provide a laser texturing process that reduces sidewall reflections in a backside illuminated CCD thereby improving device performance under both normal and stress conditions.

Another object of the invention is to provide a laser-assisted texturing process in which an excimer laser promotes a chemical reaction between an ambient and a sample.

Another object of the invention is to provide a laser-assisted texturing process in which an excimer laser promotes a chemical reaction between a halocarbon ambient and a silicon sample.

Another object of the invention is to provide a laser-assisted texturing process in which an excimer laser promotes a chemical reaction between a chlorofluorocarbon ambient and a sample.

Another object of the invention is to provide a laser texturing process in which an excimer laser promotes a chemical reaction between an ambient and a sample in which the ambient is substantially evacuated and the laser fluence is sufficient to promote ablation (vaporization) of the sample.

Yet another object of the invention is to provide a laser texturing process in which an excimer laser promotes a photolytic or pyrolytic chemical reaction between an ambient and a sample.

Another object is to provide a noncorrosive halocarbon ambient and a laser-induced chemical reaction therein to provide for a contactless texturing process.

Another object is to provide a chlorofluorocarbon ambient and a laser-induced chemical reaction therein to provide for a contactless texturing process.

Another object is to provide a texturing process using a plurality of laser beams and their associated optical interactions in conjuction with an ambient to promote surface texture combining the laser chemistry with predisposed optical intensity variations upon the sample surface.

These and other objects of the invention will become more readily apparent to one skilled in the art to which this invention pertains in view of the ensuing specification when taken in conjunction with the claims and drawings.

DESCRIPTION OF THE PREFERRED EMBODIMENT

Figure 2:
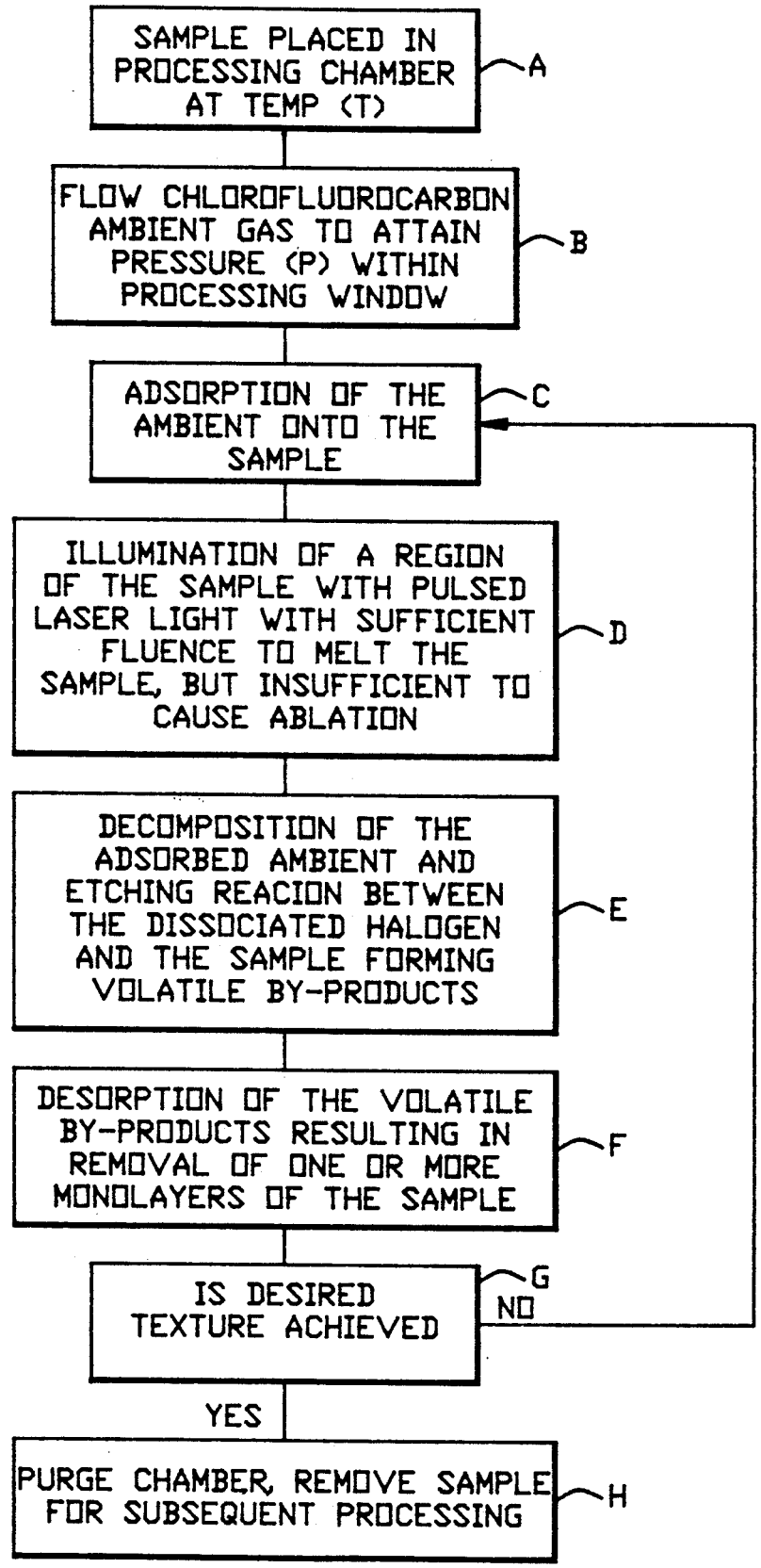
FIG. 2 shows a schematic flow chart of the inventive method.

Referring to FIG. 2, this invention concerns a contactless process for the texturing of a sample. By way of example, the teachings below pertain to a silicon sample but may be modified by one experienced in the art for samples of any composition. It is particularly well suited for roughening the sidewalls for backside illuminated CCDs, for example. A sample S which may be a wafer, wafer die or packaged device, is placed A within a halocarbon gas ambient B, such as a chlorofluorocarbon, at a predetermined pressure and temperature. There is some adsorption C of the ambient onto the silicon which is selectably illuminated D by a UV laser beam to effect a decomposition E of the adsorbed ambient. The desired region on the surface of the silicon sample is melted by the beam and one or more monolayer of silicon are removed or desorbed (etched). The etching reaction occurs since the halogen atom(s) in the adsorbed halocarbon ambient dissociates and a volatile species is formed from the reaction between the halogen and the molten silicon. The volatile reaction by-product is desorbed F from the surface and is pumped from the chamber. The halocarbon ambient is re-adsorbed onto the sample and the process repeats G if desired. The chamber may be purged H and the sample removed, if desired. Alternately, the ambient may be substantially vacuum or any othe ambient if the laser fluence is sufficient to cause ablation.

Figure 3:
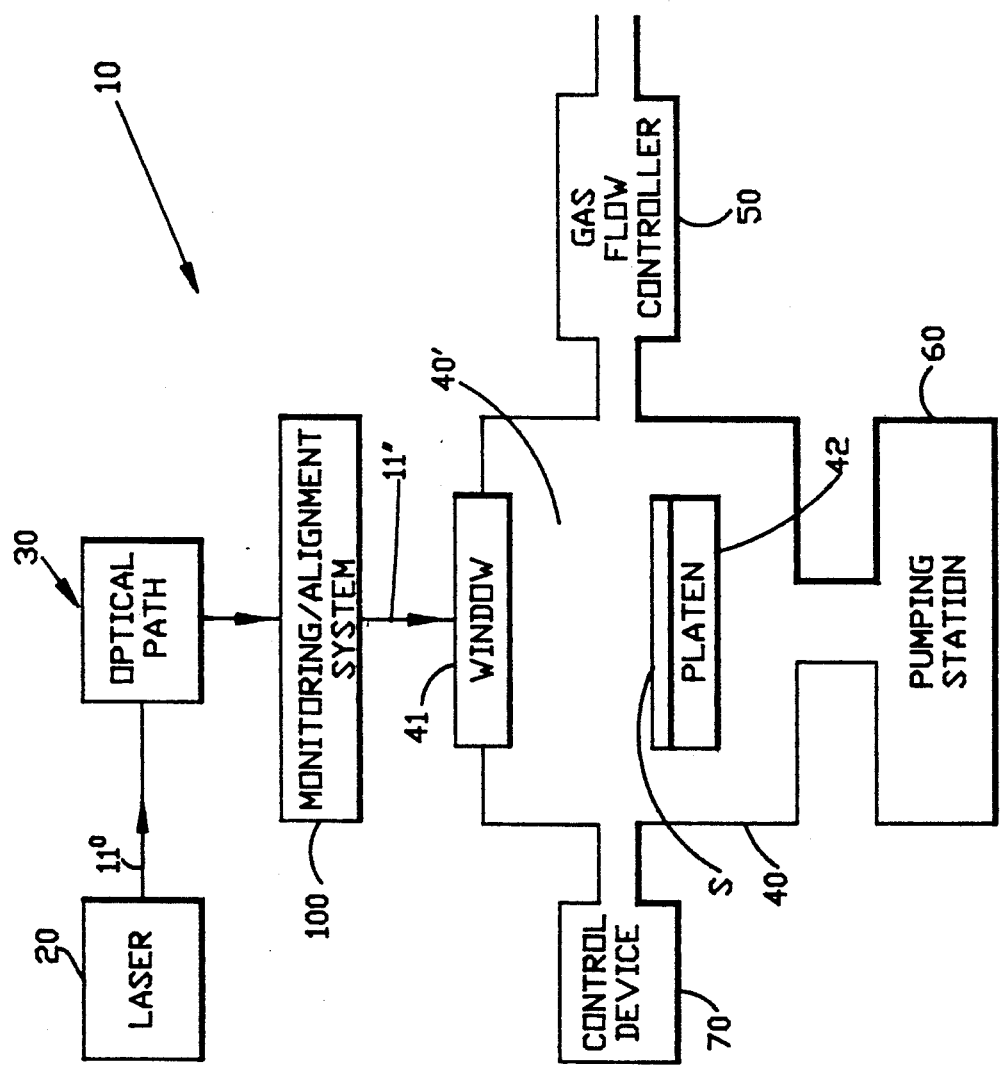
FIG. 3 schematically shows the processing setup used for excimer laser-assisted etching of silicon.

Referring now to FIG. 3 of the drawings, a laser texturing system 10 includes an excimer laser system 20 that emits a beam 11° through an optical path system 30. The optical path system homogenizes, shapes and directs the beam into a processing chamber system 40 containing a halocarbon ambient gas 40' and onto a sample S.

A gas mass flow controller system 50 is used to flow and pressurize halocarbon (chlorofluorocarbon) process and purge gases with respect to the processing chamber system. Removal of reaction by-products is accomplished via a pumping station 60 connected to the process chamber system. A capacitive manometer-process control device 70 is attached to the process chamber to monitor ambient halocarbon gas pressure. In situ monitoring/alignment system 100 is included for positioning of sample S where the laser beam which will impinge on the sample. System 100 may also include a beam diagnostic system, a reflectivity monitor, a laser alignment system, an in-situ monitoring system, and a temporal profile and energy measurement system for additional process control and diagnostics. The details of the elements of the systems are elaborated in copending U.S. patent application Ser. No. 07/501,707 by S. D. Russell et al. referenced above and will make readily apparent to those skilled in the art an appreciation of the salient features of this inventive concept. Appropriate beam deflection optics and/or sample positioning apparatus may be included in laser texturing system to provide patterned texturing as required for specific applications.

The processing parameters of interest for the laser texturing of silicon in accordance with this inventive concept are the laser fluence, number of laser pulses, ambient halocarbon gas, and ambient halocarbon gas pressure. Regulation of these parameters in accordance with the capabilities of this inventive concept permits the controlled and desired etch-processing and texturing of a silicon sample.

Figure 4:
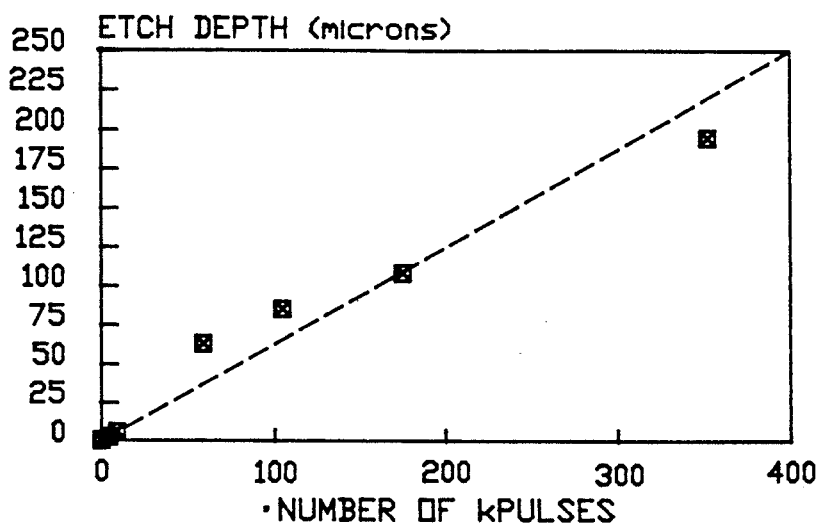
FIG. 4 shows the etch depth versus number of pulses for silicon in a chloropentafluoroethane ambient.

By way of example, FIG. 4 shows that the etch depth is a function of the number of laser pulses for silicon in a chloropentafluoroethane (Freon-115) ambient within the gas pressure process window. Substantially linear dependence is observed.

Figure 5:
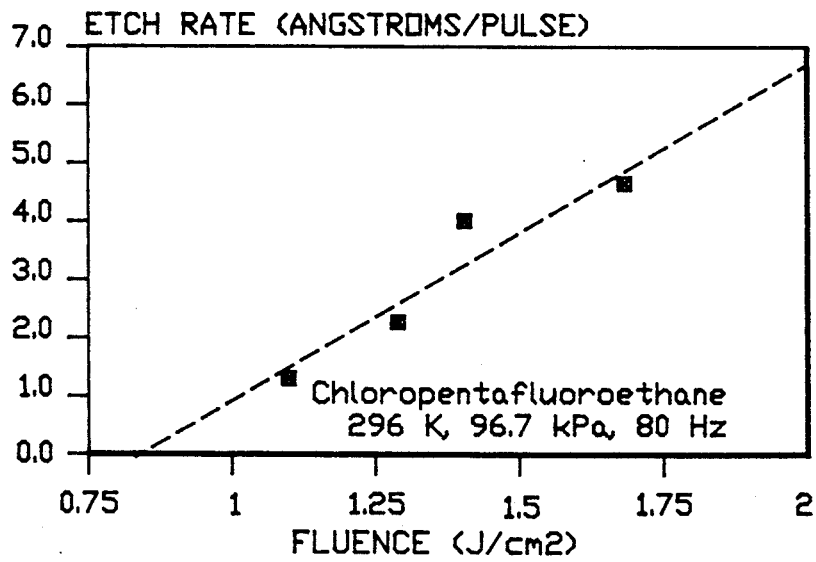
FIG. 5 represents the linear dependence of etch rate with laser fluence between the melt threshold for silicon (0.75 J/cm$^2$) and the ablation threshold (2.0 J/cm$^2$).

FIG. 5 provides an insight of the linear dependence of etch rate with laser fluence between the melt threshold for silicon (0.75 J/cm$^2$) and the ablation threshold (2.0 J/cm$^2$) at 727 torr (96.7 kPa) of chloropentafluoroethane ambient and constant temperature (196K). The square data points are with the laser at 80 Hz, the dotted line is a linear regression fit to these points exhibiting a correlation of 0.97. Operation within this fluence window allows for a controllable chemical reaction. No significant etching occurs below the melt fluence. Increasing fluence increases the duration that the silicon remains in the molten state, which results in an increased etch rate. This behavior can be explained by a one dimensional thermal model where the increase in temperature is directly proportional to the absorbed surface fluence. Comparison between the etch rates of similarly doped and processed (100) and (111) silicon samples show no difference within reasonable uncertainties. This is attributed to the etching reaction occurring while the silicon is in the molten state. The anisotropy of the etch is therefore governed by both the incident intensity profile causing the melt and the thermal diffusivity. Above the ablation threshold, vaporization reactions occur which may be suitable in some applications where control of particulates is easily handled or is of no concern.

Figure 6:
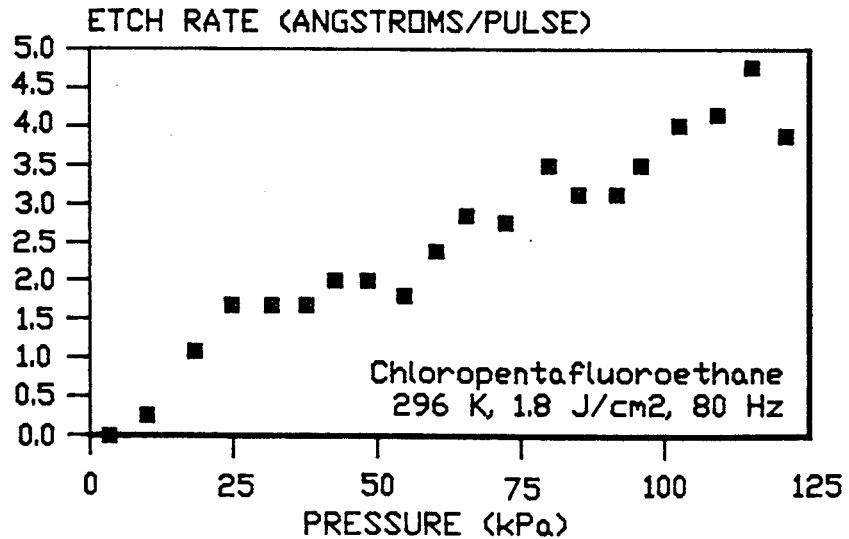
FIG. 6 represents the etch rate as a function of pressure in a chloropentafluoroethane ambient.

FIG. 6 is representative of the etch rate as a function of pressure in a chloropentafluoroethane (Freon-115) ambient. Both the fluence and sample (platen) temperature are kept at constant values, 1.8 J/cm$^2$ and 296K, respectively. Data is plotted verses the SI pressure units of kPa, with the conversion: 13.3 kPa=100 torr. At pressures below about 45 torr (6 kPa), there is no exsistence of etching. The onset of significant etching occurs at roughly 150 torr (20 kPa). Optimal processing occurs between 600 to 900 torr (about 70 to 120 kPa) where the etch rate is greater than 3 angstroms per pulse (at 1.7 J/cm$^2$). From these figures it is apparent that the pressure processing window can accommodate some variations in gas pressure, allowing for less constraining conditions and making for a less complicated manufacturing process. Etch rates as high as approximately 15 angstroms per pulse have been observed at higher fluences (and lower temperatures).

The wide processing window demonstrated here and the requirement of only a small portion of the sample surface to be etched to provide the desired texture allows for satisfactory texturing of silicon surfaces without all of the above mentioned subsystems in some applications. For example, by pressurizing a chamber at or near atmospheric pressure using chloropentafluoroethane and sealing the chamber off, a silicon surface can be textured at room temperature with laser fluences within the melting regime using 5000 to 20000 pulses.

The laser texturing of silicon, be it for the backside of CCDs or other semiconductor applications, generally follows the same procedure. The silicon sample to be etched is placed within processing chamber 41 on platen 42. A desired halocarbon ambient 40' is introduced by system 50 within a predetermined pressure range which is needed by the job at hand. Typically, the halocarbon is of the chlorofluorocarbons which by themselves are nonreactive. As mentioned above, the halocarbon ambient is introduced within the pressure range required for a desired etch rate. When chloropentafluoroethane is used, 760 torr has been found to be acceptable although other pressures may be used.

The sample may be at room temperature or maintained at a predetermined cooled temperature by resting it on a platen 42. A useful temperature at which to maintain the substrate of silicon S is 273° K. (0° C.) although other temperatures may be attained and maintained for the duration of a particular processing application as the idiosyncracies of a different job may dictate.

An excimer laser beam 11" is appropriately homogenized and shaped or may be configured or patterned, if appropriate, and directed onto the sample to be etched. The exact beam steering arrangement which forms a part of monitoring/alignment system 100 is not elaborated on at this time since a wide variety of optical beam deflection techniques have evolved over the years. Mechanical deflection schemes as well as optical deflection techniques (more optimally computer-controlled) could be used to appropriately direct beam 11" onto a desired track or pattern on the surface of silicon sample S.

The pulsed energy of beam 11" is set to obtain the optimal fluence impinging onto sample S. Given the above conditions an incident fluence of 1.7 $J/cm^2$ will result in an etch rate of about 4 angstroms per pulse. Surface roughening occurs after a few hundred pulses and the required number of laser pulses will vary with application. Next, the sample is removed from processing chamber for subsequent processing.

Figure 1:
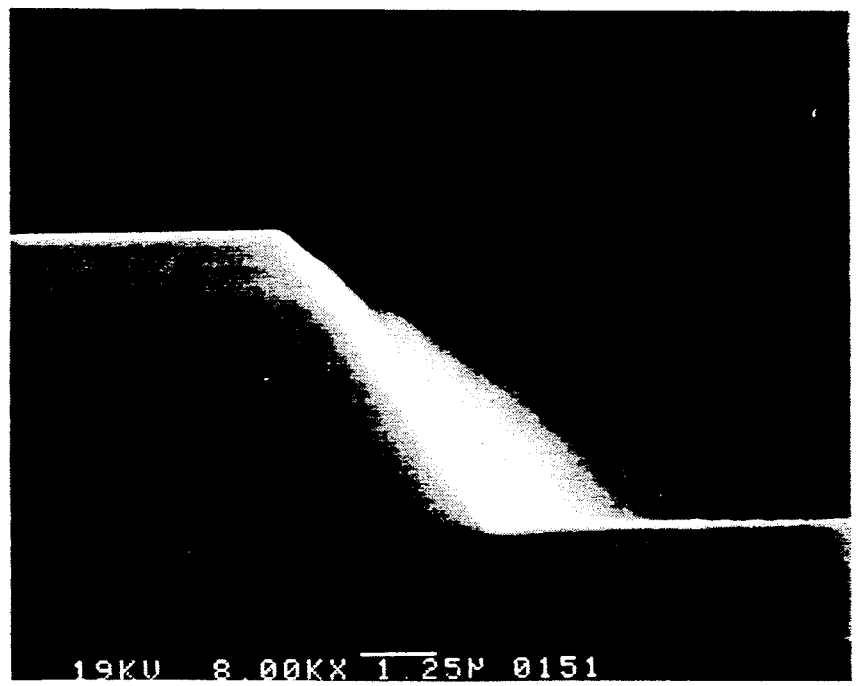
FIG. 1 shows the cross-sectional view of the smooth (111) surface from a KOH etch of silicon.
Figure 7:
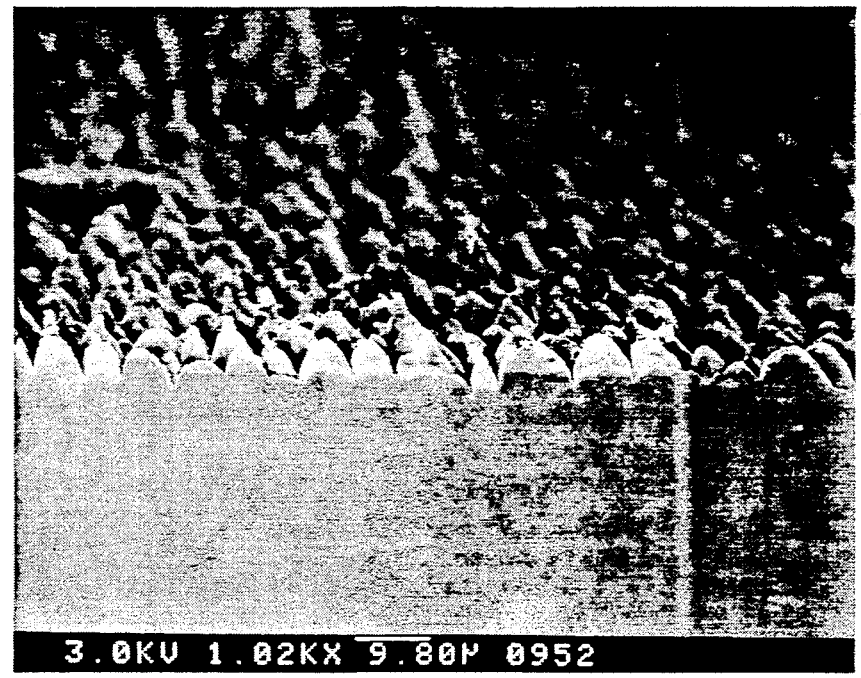
FIG. 7 is a cross-sectional view of a laser textured silicon surface.

FIG. 7 shows a cross-sectional SEM photomicrograph of the laser textured surface using chloropentafluoroethane (Freon-115). Roughness is on the order of 3 to 4 microns which is satisfactory to eliminated spurious reflections from the sidewalls of backside illuminated CCDs.

The preceding description referred to excimer laser texturing of silicon in a chloropentafluoroethane (Freon-115) ambient with incident fluences between the melt and ablation thresholds ($\sim 0.7$ $J/cm^2$ and $\sim 2.2$ $J/cm^2$ respectively). The etch rate increases with increasing ambient pressure and etch depth increases with number of laser pulses.

Laser texturing of a packaged CCD die did not damage the frontside metalization, wire bonding, or gold eutectic used for package bonding. Chloropentafluoroethane (Freon-115) does not react with any portion of the package or die, except the silicon in the area illuminated by the excimer laser. Identical results are expected for any conceivable package due to the inert nature of this gaseous halocarbon.

The laser texturing process described above may use inherently nonreactive or noncorrosive halocarbon ambients. The halocarbons only react with the silicon where the laser is impinging with sufficient fluence. Therefore, etching in a pretested packaged die can be performed without excessive handling, damage or complex masking. As a consequence, there will be a significant elimination of the processing steps to increase the overall reliability and yield. For pattern texturing the nonreactive halocarbon ambients provides a non-contact process. For sidewall texturing the laser-assisted process disclosed herein has the capability to significantly improve the performance of CCDs without many of the drawbacks of conventional techniques.

Backside illuminated CCDs which previously exhibited spurious reflections from the sidewalls were laser textured using the teachings in this application. Complete elimination of variations in the responsivity uniformity were achieved, with substantial and unexpected improvements in device resolution and background (dark) level superior to conventionally fabricated devices. These enhancements will also improve device performance and yield under stress conditions, for example in radiation environments such as in space, which tend to increase the background (dark) signal level.

The noncorrosive halocarbon ambient, laser-induced chemical reactions of the contactless texturing process is a much needed advance for the state of the art.

Other halogen-containing ambients may be suitable alternatives to the halocarbons (for example iodides, bromides, chlorides or fluorides) for etching silicon and other semiconductor compounds, metals and ceramics with appropriate variations in process parameters. Variations of substrate temperature, doping concentration and crystal orientation also can be accommodated by the method of this disclosed concept by an appropriate variation of the methods of one skilled in the art to which this invention pertains. Also, there may be applications where it is desirable to exceed the ablation threshold of the surface thereby vaporizing the sample leaving a texture without the use of an ambient gas.

The laser texturing process herein described has mentioned only pulsed UV energy for the purposes of demonstration only. Although a CW mode laser is not elaborated upon, some applications could lend themselves to the use of such a device. For the purposes of providing a more understandable disclosure of this inventive concept, it has been found to be more expedient to speak in terms of a more precisely measurable pulsed energy coming from a laser. In addition, the higher energy levels of shorter wavelengths, such as UV, have channeled the disclosure to refer to excimer lasers. Other sources of shorter wavelength energy may be used if they can produce the needed energy levels. Laser wavelength also is variable in order to vary the decomposition mechanism of the ambient gas and the adsorption depth of the sample to optimize specific production requirements. This process may utilize any light emitting source with sufficient characteristics (intensity, wavelength, etc.) to implement photo- or thermal-reactions with the sample required to impart texture to a surface. The use of lasers with long coherence lengths may allow the impinging of a plurality of beams causing an interference pattern thereby imparting a regular or predetermined texture to surfaces using well known optical techniques and the above teachings.

The laser texturing technique disclosed herein can be extended to both "passive" and "active" applications, as defined above, such as micro-machining, laser marking, or decorative patterning. Furthermore, ambients other than halocarbons discussed here may be substituted as appropriate for reactivity with the sample to be textured or texturing using the impinging laser beam without an ambient can be used in some cases. The processing may be extended to include a varity of materials including, but not limited to elemental and compound semiconductors, ceramics, and metals, for example.

The preferred embodiment disclosed above utilizes an inherently non-reactive or non-corrosive ambient. The halocarbons only react with the sample where the laser is impinging with sufficient fluence. Therefore applying a texture in a localized area can be performed without damaging nearby surfaces or using complex masking. In applications related to semiconductor processing, this will significantly eliminate processing steps thereby increasing reliability and yield and decrease cost. For passive applications discussed above, the non-contact nature of the process is an advantage over other chemical or mechanical techniques.

This process is particularly well suited for the roughening of semiconductor surfaces, however it may be applied to any surface with which a laser beam can impinge thereby effecting the surface structure.

Obviously, many modifications and variations of the present invention are possible in the light of the above teachings. It is therefore to be understood that within the scope of the appended claims the invention may be practiced otherwise than specifically described.

We claim:

1. A method of texturing a surface of a sample to have a roughness using laser-assisted etching in an ambient comprising:

placing said surface of said sample in contact with said ambient;

directing radiant energy onto said surface of said sample within said ambient to create at least melted portions of said surface in a textured pattern where the radiant energy impinges; and removing away by the action of said directing radiant energy only said at least melted portions of said surface of said sample to provide a textured roughness sufficient to eliminate most spurious reflections within said ambient which have said radiant energy impinging thereon.

2. A method according to claim 1 in which said radiant energy is a UV wavelength beam coming from a laser.

3. A method according to claim 2 in which said surface of said sample is placed within a processing chamber and said gaseous ambient is pressurized within predetermined limits and said UV wavelength beam is at predetermined rates and intensities to assure that said surface of said sample is melted but not ablated thereby.

4. A method according to claim 3 in which said UV wavelength beam is shaped, homogenized and adjusted in magnitude to obtain an optimal fluence impinging onto said surface of said sample.

5. A method according to claim 1, 2, 3 or 4 in which said sample is an elemental semiconductor such as silicon.

6. A method according to claim 1, 2, 3 or 4 in which said sample is any combination of semiconductor compounds.

* * * * *